United States Patent
Kanome et al.

(10) Patent No.: US 9,461,086 B2
(45) Date of Patent: Oct. 4, 2016

(54) METHOD OF MANUFACTURING SEMICONDUCTOR DEVICE

(71) Applicant: CANON KABUSHIKI KAISHA, Tokyo (JP)

(72) Inventors: Atsushi Kanome, Tokyo (JP); Takashi Usui, Ashigarakami-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/995,397

(22) Filed: Jan. 14, 2016

(65) Prior Publication Data

US 2016/0240576 A1    Aug. 18, 2016

(30) Foreign Application Priority Data

Feb. 16, 2015    (JP) ................. 2015-027943

(51) Int. Cl.
| | |
|---|---|
| *H01L 21/4763* | (2006.01) |
| *H01L 27/146* | (2006.01) |
| *H01L 21/3065* | (2006.01) |
| *H01L 21/768* | (2006.01) |

(52) U.S. Cl.
CPC ... *H01L 27/14636* (2013.01); *H01L 27/14623* (2013.01); *H01L 27/14685* (2013.01); *H01L 27/14689* (2013.01); *H01L 21/3065* (2013.01); *H01L 21/76804* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 6,548,394 B1* | 4/2003 | Peng et al. | H01L 21/76895 257/296 |
| 6,903,022 B2* | 6/2005 | Peng et al. | H01L 27/1052 257/E21.507 |
| 7,537,990 B2 | 5/2009 | Yoshida | |
| 8,207,066 B2 | 6/2012 | Inoue et al. | |
| 2004/0219462 A1* | 11/2004 | Chen et al. | H01L 21/76885 430/311 |
| 2008/0076250 A1 | 3/2008 | Yoshida | |
| 2010/0243605 A1 | 9/2010 | Nishizuka | |
| 2010/0255612 A1 | 10/2010 | Inoue et al. | |
| 2011/0175233 A1* | 7/2011 | Ueki | H01L 21/76811 257/774 |
| 2014/0239387 A1* | 8/2014 | Chen | H01L 21/823487 257/334 |
| 2015/0024588 A1* | 1/2015 | Chen et al. | H01L 21/76843 438/653 |

FOREIGN PATENT DOCUMENTS

| | | |
|---|---|---|
| JP | 9-148270 A | 6/1997 |
| JP | 2000-150632 A | 5/2000 |
| JP | 2008-053516 A | 3/2008 |
| JP | 2008-85006 A | 4/2008 |
| JP | 2010-245101 A | 10/2010 |
| JP | 2010-287823 A | 12/2010 |

* cited by examiner

*Primary Examiner* — Thanh T Nguyen
(74) *Attorney, Agent, or Firm* — Fitzpatrick, Cella, Harper & Scinto

(57) ABSTRACT

A method of manufacturing a semiconductor device, comprising forming an insulating member on a structure having a height difference, and forming openings in the insulating member, the forming openings including first etching under a condition with a microloading phenomenon and second etching under a condition with a reverse microloading phenomenon, wherein the first etching is stopped before an upper face of the structure is exposed and then the second etching is started.

14 Claims, 4 Drawing Sheets

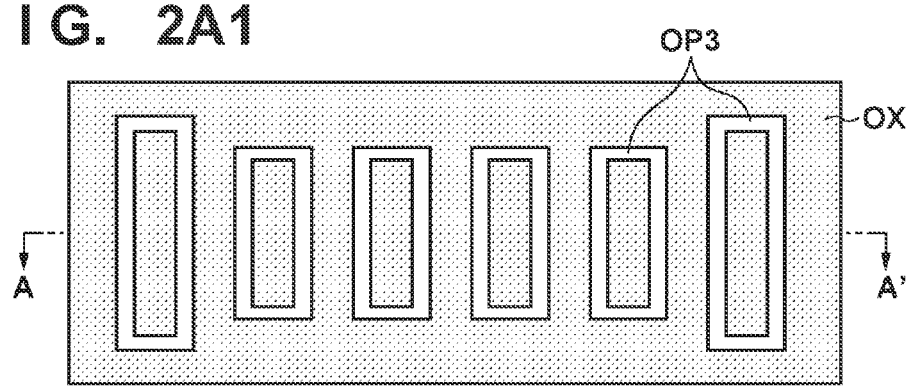
FIG. 2A1
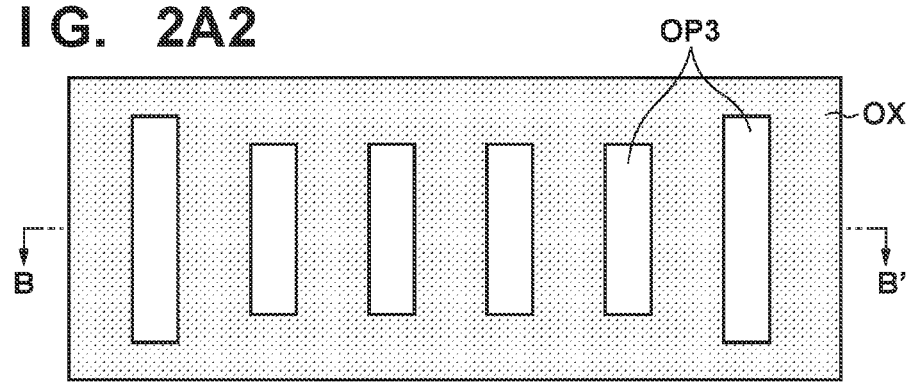
FIG. 2A2
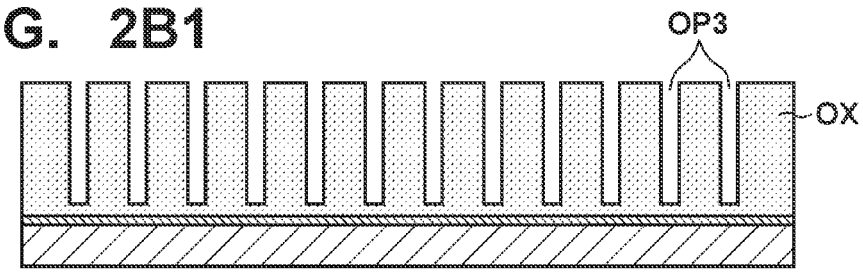
FIG. 2B1
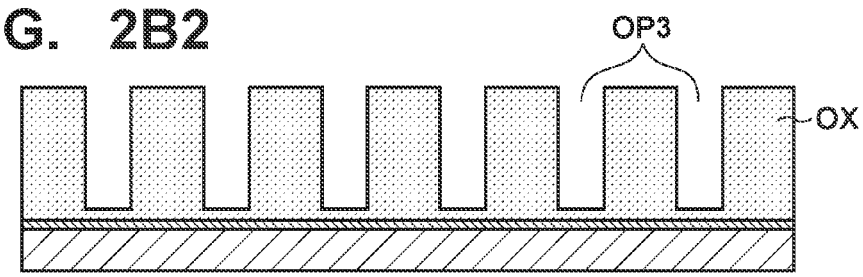
FIG. 2B2

METHOD OF MANUFACTURING SEMICONDUCTOR DEVICE

BACKGROUND OF THE INVENTION

1. Field of the Invention

The present invention relates to a method of manufacturing a semiconductor device.

2. Description of the Related Art

In a semiconductor manufacturing step, there is required a technique of forming an opening (for example, an opening for a contact plug) in an insulating member such as an interlayer dielectric film and simultaneously forming another opening having a larger width (size) and a smaller depth than the opening. For example, an alignment mark, a guard ring, or the like can be formed by forming a metal member in the other opening. In a solid-state image sensor including a photoelectric conversion portion, for example, a light-shielding member can be formed at a position close to the upper surface of the semiconductor substrate by forming a metal member in the other opening.

When forming a plurality of openings, whose widths are different from each other, in an insulating member by dry etching, the etching amount per unit time and unit area, that is the etching rate, of the insulating member may be larger in an opening with a larger width than in an opening with a smaller width depending on the etching condition (microloading phenomenon). Depending on another etching condition, the etching amount per unit time and unit area, that is the etching rate, of the insulating member may be larger in an opening with a smaller width than in an opening with a larger width (reverse microloading phenomenon). For this reason, it is not easy to form a plurality of openings, whose widths are different from each other, in an insulating member in consideration of their depths.

Japanese Patent Laid-Open No. 2010-287823 discloses a technique of forming a plurality of openings, whose depths are equal to each other and whose widths are different from each other, using etching with the microloading phenomenon and etching with the reverse microloading phenomenon.

The present inventor attempted to form an opening for a contact plug in an insulating member and simultaneously form an opening for an alignment mark (another opening having a larger width and a smaller depth than the opening for a contact plug) using the above-described two types of etching. A structure serving as the underlying material of the insulating member generally has unevenness (height difference) on the upper surface because of, for example, the gate electrode of a transistor formed on the semiconductor substrate. In this case, the insulating member includes portions whose thicknesses are different from each other. More specifically, the portion on a convex portion of the structure out of the insulating member has a thickness smaller than that of the portion on a concave portion of the structure. For this reason, when forming an opening for a contact plug on each of the convex and concave portions of the structure, the convex portion of the structure is exposed first. The convex portion of the structure may be damaged largely until the concave portion of the structure is exposed.

SUMMARY OF THE INVENTION

It is an object of the present invention to provide a technique advantageous for, when forming an opening and another opening having a larger width and a smaller depth than the opening in an insulating member using the above-described two types of etching, reducing damage to a portion exposed by the opening out of a structure serving as the underlying material of the insulating member.

One of the aspects of the present invention provides a method of manufacturing a semiconductor device, comprising forming an insulating member on a structure, an upper surface of the structure including a first portion with a first height, a second portion with a second height higher than the first height, a third portion with a third height lower than the second height, and forming a plurality of openings in the insulating member, wherein the forming the plurality of openings, comprises etching the insulating member under a first condition that makes an etching amount per unit time and unit area of the insulating member larger as a size of the opening becomes larger, and etching the insulating member under a second condition that makes the etching amount per unit time and unit area of the insulating member larger as the size of the opening becomes smaller, after the etching the insulating member under the first condition, in the etching the insulating member under the first condition, a first opening, which has a first width and whose bottom surface is higher than the second height, is formed on the first portion with the first height, a second opening, which has a second width and whose bottom surface is higher than the second height, is formed on the second portion with the second height, and a third opening, which has a third width larger than the first width and the second width and whose bottom surface is higher than the second height, is formed on the third portion with the third height, and in the etching the insulating member under the second condition, portions under the first opening and the second opening out of the insulating member are removed so as to expose the first portion with the first height and the second portion with the second height while leaving a portion of the insulating member between the third opening and the third portion.

Further features of the present invention will become apparent from the following description of exemplary embodiments with reference to the attached drawings.

BRIEF DESCRIPTION OF THE DRAWINGS

FIGS. 2A1, 2A2, 2B1, and 2B2 are views for explaining examples of the shapes of openings formed in an insulating member;

DESCRIPTION OF THE EMBODIMENTS

Figure 1:
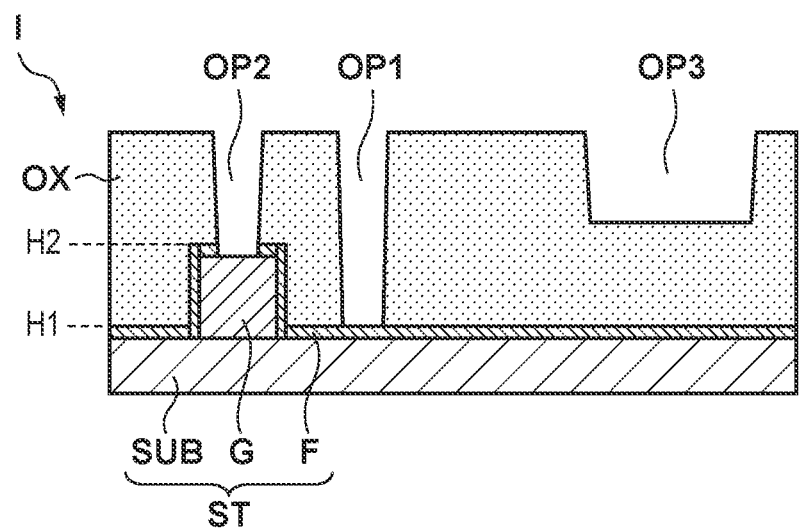
FIG. 1 is a view for explaining an example of the structure of a semiconductor device.

FIG. 1 is a schematic view for explaining a structure halfway through steps in the manufacture of a semiconductor device I. The semiconductor device I includes an structure ST, and an insulating member OX formed on the structure ST. The structure ST has a height difference on the upper surface, and has a first height H1 and a second height H2 higher than the height H1. In other words, the upper surface of the structure ST includes a first portion with the first height H1 and a second portion with the second height H2. The structure ST includes, for example, a semiconductor substrate SUB, a MOS transistor (only a gate electrode G is illustrated here) formed on the substrate SUB, and an insulating film F that covers them. The height difference on the upper surface of the structure ST complies with the thickness of the gate electrode G. The thickness of the gate electrode G is, for example, about 50 to 200 nm.

The insulating member OX is, for example, the insulating film of the first layer out of a plurality of interlayer dielectric films. The insulating member OX has a plurality of openings including openings OP1 to OP3. A metal member is provided later in each of the openings OP1 to OP3. The depth of the opening OP1 is larger than the depths of the openings OP2 and OP3. The depth of the opening OP3 is typically smaller than the depth of the opening OP2 but may be larger than the depth of the opening OP2.

More specifically, as shown in FIG. 1, the insulating member OX includes two portions whose thicknesses are different from each other because of the gate electrode G (that is, a portion located on a portion where the gate electrode G does not exist and having a large thickness and a portion located on a portion where the gate electrode G exists and having a small thickness). For example, the thickness of the portion with the large thickness is about 300 to 700 nm. The opening OP1 is formed in the portion with the large thickness out of the insulating member OX. The depth of the opening OP1 is equal to or larger than the thickness of the portion with the large thickness. On the other hand, the opening OP2 is formed in the portion with the small thickness out of the insulating member OX. The thickness of the portion with the small thickness actually has a value (for example, about 200 to 600 nm, typically, 300 to 500 nm) obtained by subtracting the height difference on the upper surface of the structure ST from the above-described thickness of the portion with the large thickness.

A metal member provided in the opening OP1 forms (an expression "constitutes" may be used instead), for example, a contact plug connected to the source or drain of the transistor. A metal member provided in the opening OP2 forms a contact plug connected to the gate electrode G. A metal member provided in the opening OP3 forms, for example, an alignment mark (or a part thereof).

The depth of the opening OP3 for an alignment mark will be described here. For example, when performing exposure processing for an object such as a semiconductor wafer using an exposure apparatus, the exposure apparatus is adjusted using an alignment mark. More specifically, an object having an alignment mark is irradiated with light, and the alignment mark is detected based on the reflected light. More specifically, the alignment mark has a height difference, and contrast is generated because the phase of the reflected light shifts due to the height difference (the phase shifts between the reflected light from the portion with the large height and the reflected light from the portion with the small height). The alignment mark can be detected based on the contrast. To facilitate detection of the alignment mark, for example, the height difference of the alignment mark (that is, the depth of the opening OP3) is preferably set to 50 nm or more, and typically, about 100 nm or more. The height difference may be suppressed to 400 nm or less.

FIGS. 2A1, 2B1, 2A2, and 2B2 are schematic views showing examples of the opening OP3 for an alignment mark. FIG. 2A1 is a plan view of the first example of the shape of the opening OP3, and FIG. 2B1 shows the sectional structure taken along a cut line A-A'. FIG. 2A2 is a plan view of the second example of the shape of the opening OP3, and FIG. 2B2 shows the sectional structure taken along a cut line B-B'. The opening OP3 need only have a predetermined trench, and can have an arbitrary shape such as a circular shape, a polygonal shape, or a linear shape in a plan view (a plan view of the upper surface of the substrate SUB). For example, the opening OP3 may be formed into a ring shape, as shown in FIGS. 2A1 and 2B1, or a rectangular shape, as shown in FIGS. 2A2 and 2B2, in the plan view.

In this example, an example in which the metal member provided in the opening OP3 forms an alignment mark has been described. However, the present invention is not limited to this example. For example, the metal member may form a guard ring (or a part thereof) provided along the periphery of the semiconductor device I (or a semiconductor chip). If the semiconductor device I is a solid-state image sensor including a photoelectric conversion portion, the metal member may form a light-shielding member (or a part thereof) configured to limit light to the photoelectric conversion portion or limit light to a portion other than the photoelectric conversion portion. Note that the portion other than the photoelectric conversion portion includes, for example, a pixel transistor such as an amplification transistor in a CMOS image sensor or a charge holding portion configured to hold signal charges generated by the photoelectric conversion portion in a CMOS image sensor having a global electronic shutter structure.

Note that a wiring pattern (the first wiring layer or a wiring layer of higher level) or another insulating member (the interlayer dielectric film of the second layer or a layer of higher level) can be arranged on the insulating member OX and the metal members provided in the openings OP1 to OP3, though not illustrated for the descriptive convenience.

Out of a method of manufacturing the semiconductor device I, steps of forming the above-described openings OP1 to OP3 will mainly be described below as an embodiment with reference to FIGS. 3A to 3H. The semiconductor device I can be manufactured using a known semiconductor manufacturing process.

Figure 3A:
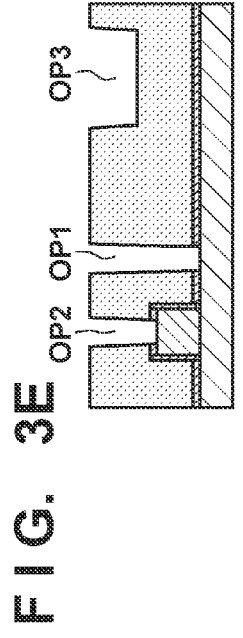
FIGS. 3A to 3H are views for explaining an example of a method of manufacturing the semiconductor device.

In the step shown in FIG. 3A, the elements of a MOS transistor or the like are formed on a substrate SUB made of silicon or the like, and after that, an insulating film F is formed so as to cover the substrate SUB and a gate electrode G of the transistor. The film F is made of, for example, silicon nitride. The film F can function as an etching stopper, as will be described later. If the semiconductor device I is a solid-state image sensor, the film F can be arranged on a photoelectric conversion portion and thus function as an antireflection film. A structure ST is thus obtained.

An insulating member OX is formed on the structure ST. The insulating member OX is made of, for example, silicon oxide. After the insulating member OX is formed by a deposition method, its upper surface is planarized by CMP (Chemical Mechanical Polishing).

Figure 3B:
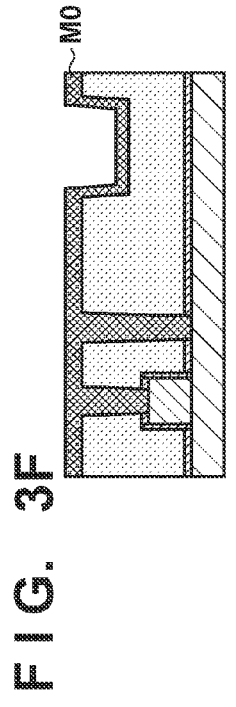

In the step shown in FIG. 3B, a resist pattern R is formed on the insulating member OX. The resist pattern R has openings OP10, OP20, and OP30. The opening OP10 of the resist pattern R corresponds to the above-described opening OP1 to be formed in the insulating member OX. Similarly, the openings OP20 and OP30 of the resist pattern R correspond to the above-described openings OP2 and OP3 to be formed in the insulating member OX, respectively.

Figure 3C:
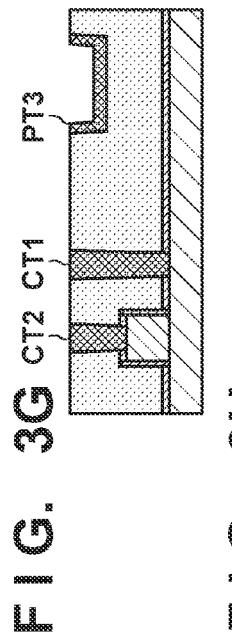
Figure 4A:
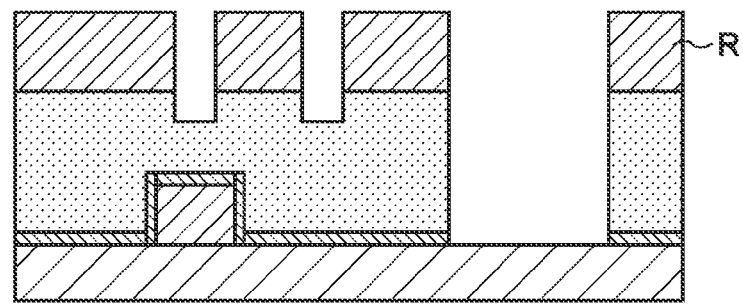
FIGS. 4A and 4B are views for explaining a microloading phenomenon and a reverse microloading phenomenon.

In the step (to be referred to as "step S1") shown in FIG. 3C, first etching is performed for the insulating member OX. This etching is performed under a condition with a microloading phenomenon. More specifically, etching with the microloading phenomenon means etching performed under a condition that increases the etching amount per unit time and unit area (the etching rate) of the insulating member OX as the width (size) of an opening becomes large, as shown in FIG. 4A. This phenomenon occurs probably because the amounts of an etching gas, ions, radicals, and the like which reach the bottom are smaller in an opening with a small width than in an opening with a large width.

For example, in step S1, etching is performed under a gas atmosphere containing $C_4F_8$ and Ar. In step S1, openings OP11, OP21, and OP31 are formed in the insulating member OX under this condition. The opening OP11 is formed on (above) the upper surface of the structure ST with a height H1, and has a first width W1. The opening OP21 is formed on (above) the upper surface of the structure ST with a height H2, and has a second width W2. The opening OP31 is formed on (above) the upper surface of the structure ST with the height H1 at a position different from the opening OP11, and has a third width W3. Typically, the widths W1 and W2 fall within the range of 0.15 μm to 0.4 μm, and the width W3 falls within the range of 0.4 μm to 2 μm. The width W3 is larger than the widths W1 and W2. The widths W1 and W2 may be equal to each other or different from each other. Note that each of the openings OP11, OP21, and OP31 may be tapered. In this case, as for the dimensional relationship between the widths of the openings OP11, OP21, and OP31, the widths are compared on the upper surface of the insulating member OX. All the bottom surfaces of the openings OP11, OP21, and OP31 are located at heights more than the height H2. According to the etching condition in step S1, the bottom surface of the opening OP31 is located at a position higher than the bottom surfaces of the openings OP11 and OP21.

Figure 3D:
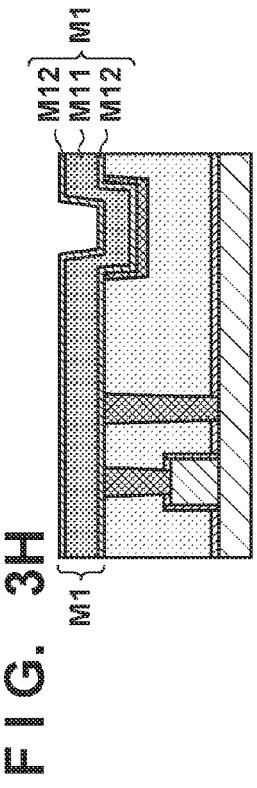
Figure 4B:
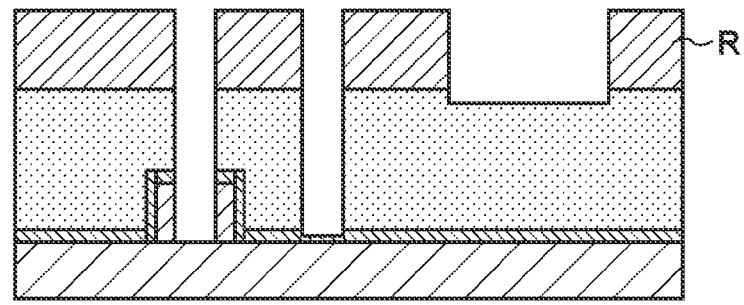

In the step (to be referred to as "step S2") shown in FIG. 3D, second etching is performed for the insulating member OX. This etching is performed under a condition with a reverse microloading phenomenon. More specifically, etching with the reverse microloading phenomenon means etching performed under a condition that increases the etching amount per unit time and unit area (the etching rate) of the insulating member OX as the width of an opening becomes small, as shown in FIG. 4B. This phenomenon occurs probably because the amount of a reaction product that is formed on the bottom and can impede etching is larger in an opening with a large width than in an opening with a small width.

For example, in step S2, etching is performed under a gas atmosphere containing $C_4F_6$ and $O_2$. In step S2, portions under the openings OP11 and OP21 are removed so as to expose the upper surfaces of the structure ST with the heights H1 and H2 while leaving the portion under the opening OP31 out of the insulating member OX under this condition. In step S2, openings OP12, OP22, and OP32 are formed.

The etching condition in step S2 is set to make the etching amount of the insulating member OX larger than the etching amount of the structure ST (that is, make the selectivity of the insulating member OX higher). In this example, the structure ST serving as the underlying material of the insulating member OX (silicon oxide) includes the insulating film F (silicon nitride) that covers the surface of the structure ST and is made of a material different from the insulating member OX. The film F functions as an etching stopper under the etching condition of step S2.

Note that the openings OP12, OP22, and OP32 correspond to the openings OP11, OP21, and OP31 formed in step S1 described above, respectively. In other words, the openings OP11, OP21, and OP31 formed in step S1 are shaped into the openings OP12, OP22, and OP32, respectively, in step S2.

Note that under the etching condition of step S2, the etching amount of the insulating member OX in the opening OP31 is relatively small. However, the etching amount may substantially be zero. In this case, the depth of the opening OP31 may substantially equal the depth of the opening OP32.

Figure 3E:
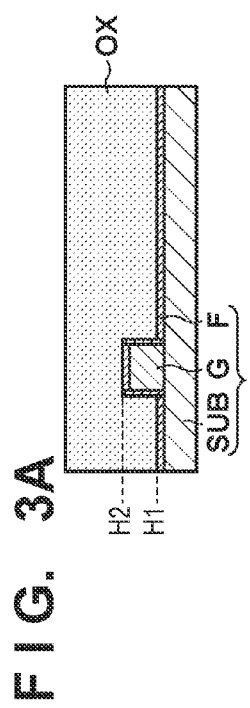

In the step shown in FIG. 3E, out of the film F, portions exposed by the openings are removed by etching to expose the upper surface of the gate electrode G and the upper surface of the substrate SUB corresponding to the openings. The openings OP1, OP2, and OP3 described with reference to FIG. 1 are formed in this step, and correspond to the openings OP12, OP22, and OP32 formed in step S2 described above, respectively. In other words, the openings OP12, OP22, and OP32 formed in step S2 are shaped into the openings OP1, OP2, and OP3, respectively, in this step.

Figure 3F:
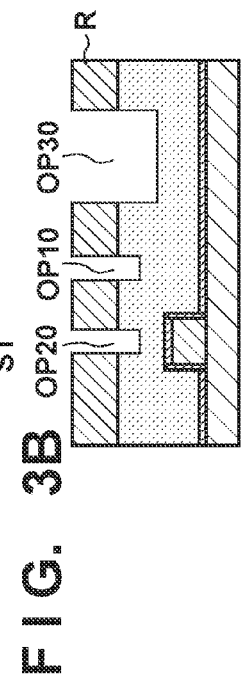
Figure 3G:
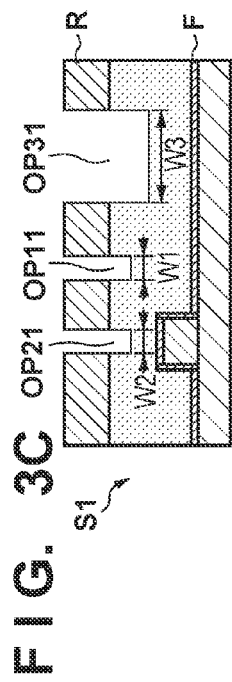

After that, in the steps shown in FIGS. 3F and 3G, metal members are formed in the openings OP1 to OP3. More specifically, the openings OP1 and OP2 are filled with metal members to form contact plugs CT1 and CT2. In addition, a metal member is formed in the opening OP3 so as to form an upper surface with a concave shape while covering the side surface and the bottom portion of the opening OP3, thereby forming a portion PT3 that is a part of an alignment mark. More specifically, as shown in FIG. 3F, a metal member M0 whose thickness is smaller than the depth of the opening OP3 is formed on the insulating member OX with the openings OP1 to OP3. After that, as shown in FIG. 3G, the deposited metal member M0 is partially removed by CMP so as to expose the upper surface of the insulating member OX. Note that the metal member M0 may contain a barrier metal (for example, titanium or titanium nitride) in addition to a metal (for example, tungsten or copper) used to electrically connect the terminal of each element to a predetermined wiring pattern.

Figure 3H:
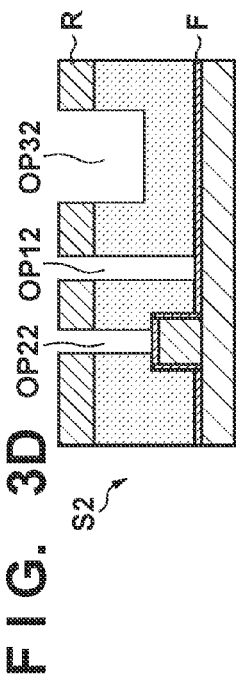

Finally, as shown in FIG. 3H, a metal member M1 used to form a wiring pattern and the like is deposited. The metal member M1 has, on its upper surface, a height difference formed according to the upper surface of the insulating member OX and the opening OP3 in which the portion PT3 is formed. The alignment mark can be detected based on the height difference. After that, the metal member M1 is patterned. Note that the metal member M1 may include a first portion M11 made of aluminum, copper, or the like, and second portions M12 arranged on the lower and upper surfaces of the first portion and made of titanium, titanium nitride, or the like. Each portion M12 can function as a barrier metal or antireflection film.

According to the above-described embodiment, the step of forming the openings OP1 to OP3 mainly includes two etching steps S1 and S2. In step S1, etching with the microloading phenomenon is performed. In step S2, etching with the reverse microloading phenomenon is performed.

If the openings OP1 to OP3 are formed only by the etching with the reverse microloading phenomenon (without using the etching with the microloading phenomenon), it is difficult to form the opening OP3 while ensuring a sufficient depth. FIG. 4B shows a form in which etching in the openings with small widths progresses to damage the gate electrode G during formation of the opening with a large width. When both the etching with the microloading phenomenon and the etching with the reverse microloading phenomenon are used, it is possible to form the openings OP1 and OP2 and simultaneously form the opening OP3 while ensuring a sufficient depth.

In the etching with the reverse microloading phenomenon, the selectivity of the insulating member OX to the structure ST (in this example, the film F) is higher than in the etching with the microloading phenomenon. Hence, the etching with the microloading phenomenon is performed first, and the etching with the reverse microloading phenomenon is performed after that. For example, when the distance from the height H2 to the upper surface of the insulating member OX is about 350 nm, etching in step S1 is stopped to suppress the etching amount of the insulating member OX to 300 nm or less, and then, etching in step S2 is started. This makes it possible to prevent damage to the upper surface of the gate electrode G and generally reduce damage to the upper surface of the structure ST with the height H1 as compared to a case in which steps S1 and S2 are performed in reverse order.

Note that the present invention is not limited to the above-described embodiment, and part (for example, parameters and materials described in the above embodiment) thereof may appropriately be changed without departing from the scope of the present invention. For example, both the openings OP1 and OP3 are formed on the substantially same height (the height H1, in the above-mentioned embodiment). However, in other embodiments, the openings OP1 and OP3 may be formed on the unevenness (the height difference) on the upper surface, the unevenness being at least less than the difference between the heights H1 and H2. In other words, the upper surface of the structure ST may further include a third portion with a third height lower the second height H2, and the opening OP3 may be formed on the third portion of the upper surface of the structure ST.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-027943, filed Feb. 16, 2015, which is hereby incorporated by reference herein in its entirety.

What is claimed is:

1. A method of manufacturing a semiconductor device, comprising:
   forming an insulating member on a structure, an upper surface of the structure including a first portion with a first height, a second portion with a second height higher than the first height, a third portion with a third height lower than the second height; and
   forming a plurality of openings in the insulating member,
   wherein the forming the plurality of openings comprises:
   etching the insulating member under a first condition that makes an etching amount per unit time and unit area of the insulating member larger as a size of the opening becomes larger; and
   etching the insulating member under a second condition that makes the etching amount per unit time and unit area of the insulating member larger as the size of the opening becomes smaller, after the etching the insulating member under the first condition,
   in the etching the insulating member under the first condition,
      a first opening, which has a first width and whose bottom surface is higher than the second height, is formed on the first portion with the first height,
      a second opening, which has a second width and whose bottom surface is higher than the second height, is formed on the second portion with the second height, and
      a third opening, which has a third width larger than the first width and the second width and whose bottom surface is higher than the second height, is formed on the third portion with the third height, and
   in the etching the insulating member under the second condition, portions under the first opening and the second opening out of the insulating member are removed so as to expose the first portion with the first height and the second portion with the second height while leaving a portion of the insulating member between the third opening and the third portion.

2. The method according to claim 1, wherein the structure includes a semiconductor substrate and a MOS transistor formed on the semiconductor substrate, and
   a height difference on the upper surface of the structure formed by the first height and the second height complies with a thickness of a gate electrode of the MOS transistor.

3. The method according to claim 1, wherein in the etching the insulating member under the second condition, etching is performed under a condition that makes the etching amount of the insulating member larger than the etching amount of the structure.

4. The method according to claim 1, wherein a surface of the structure is covered with an insulating film made of a material different from the insulating member, and
   in the etching the insulating member under the second condition, the insulating film functions as an etching stopper.

5. The method according to claim 4, wherein the insulating member is made of silicon oxide, and the insulating film is made of silicon nitride.

6. The method according to claim 1, wherein in the etching the insulating member under the first condition, etching is performed under a gas atmosphere containing $C_4F_8$ and Ar, and
   in the etching the insulating member under the second condition, etching is performed under a gas atmosphere containing $C_4F_6$ and $O_2$.

7. The method according to claim 1, wherein the first width and the second width fall within a range of 0.15 μm to 0.4 μm, and
   the third width falls within a range of 0.4 μm to 2 μm.

8. The method according to claim 1, further comprising forming a metal member in each of the plurality of openings after the forming the plurality of openings.

9. The method according to claim 8, wherein in the forming the metal member,
   each of an opening that is formed in the forming the plurality of openings and corresponds to the first opening and an opening that is formed in the forming the plurality of openings and corresponds to the second opening is filled with a metal member, and
   a metal member is formed in an opening that is formed in the forming the plurality of openings and corresponds to the third opening such that the metal member forms an upper surface with a concave shape while covering a side surface and a bottom portion of the opening.

10. The method according to claim 8, wherein the forming the metal member comprises:
    depositing, on the insulating member with the plurality of openings, the metal member to a thickness smaller than a depth of the opening corresponding to the third opening; and
    partially removing the deposited metal member by chemical mechanical polishing so as to expose an upper surface of the insulating member.

11. The method according to claim 8, wherein the metal member formed in the opening corresponding to the third opening constitutes an alignment mark.

12. The method according to claim 8, wherein the metal member formed in the opening corresponding to the third opening constitutes a guard ring.

13. The method according to claim 8, wherein the semiconductor device comprises a solid-state image sensor including a photoelectric conversion portion, and
   the metal member formed in the opening corresponding to the third opening constitutes a light-shielding member configured to limit light.

14. The method according to claim 1, wherein the third height of the third portion is equal to the first height of the first portion.

\* \* \* \* \*